United States Patent
Miyamoto et al.

(10) Patent No.: US 7,366,004 B2
(45) Date of Patent: Apr. 29, 2008

(54) MEMORY

(75) Inventors: Hideaki Miyamoto, Ogaki (JP);
Naofumi Sakai, Kitakyusyu (JP);
Kouichi Yamada, Gifu (JP); Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 174 days.

(21) Appl. No.: 11/328,223

(22) Filed: Jan. 10, 2006

(65) Prior Publication Data
US 2006/0164877 A1   Jul. 27, 2006

(30) Foreign Application Priority Data
Jan. 21, 2005   (JP)   ............................. 2005-013710

(51) Int. Cl.
*G11C 11/22* (2006.01)
(52) U.S. Cl. ........................ 365/145; 365/203
(58) Field of Classification Search ............... 365/145, 365/203, 189.04
See application file for complete search history.

(56) References Cited

U.S. PATENT DOCUMENTS

| | | | |
|---|---|---|---|
| 6,023,438 A | * | 2/2000 | Tanaka et al. ............... 365/210 |
| 6,434,039 B1 | * | 8/2002 | Braun et al. ................. 365/145 |
| 6,487,103 B2 | | 11/2002 | Yamamoto et al. |
| 6,661,697 B2 | | 12/2003 | Yamamoto et al. |
| 6,970,371 B1 | * | 11/2005 | Summerfelt et al. ........ 365/145 |

FOREIGN PATENT DOCUMENTS

JP   2002-133857 A   5/2002

* cited by examiner

*Primary Examiner*—Anh Phung
(74) *Attorney, Agent, or Firm*—McDermott Will & Emery LLP

(57) ABSTRACT

A memory capable of suppressing reduction of a reading voltage in data reading regardless of dispersion in a manufacturing process is provided. This memory comprises charge storage means, a first field-effect transistor and data determination means. The memory sets a voltage between a control terminal and a remaining first terminal of the first field-effect transistor to a threshold voltage for bringing the first field-effect transistor into an OFF-state in the vicinity of a boundary state between ON- and OFF-states through the threshold voltage of the first field-effect transistor.

20 Claims, 6 Drawing Sheets

MEMORY

BACKGROUND OF THE INVENTION

1. Field of the Invention

The present invention relates to a memory, and more particularly, it relates to a memory including memory cells holding data.

2. Description of the Background Art

A ferroelectric memory including memory cells holding data is known in general, as disclosed in Japanese Patent Laying-Open No. 2002-133857, for example.

In the ferroelectric memory including memory cells disclosed in the aforementioned Japanese Patent Laying-Open No. 2002-133857, a charge transfer transistor is connected to each bit line connected with the corresponding memory cell and a capacitor storing charge for controlling transfer of the charge from the bit line to the capacitor. In data reading, the ferroelectric memory determines data read from the memory cell on the basis of a voltage resulting from the charge transferred from the memory cell to the capacitor through the bit line and the charge transfer transistor. Further, the ferroelectric memory disclosed in Japanese Patent Laying-Open No. 2002-133857 generates a voltage corresponding to the threshold voltage Vt of the charge transfer transistor through the threshold voltage of a p-channel transistor in a separately provided threshold voltage generation circuit before reading the data. The ferroelectric memory applies the generated threshold voltage to the gate of the charge transfer transistor for holding the gate-to-source voltage $V_{GS}$ of the charge transfer transistor at the threshold voltage Vt, thereby holding the charge transfer transistor in an OFF-state in the vicinity of a boundary state between ON- and OFF-states. Thus, the ferroelectric memory disclosed in the aforementioned Japanese Patent Laying-Open No. 2002-133857 inputs the charge responsive to the data of the memory cell in the source of the charge transfer transistor from the bit line in data reading, for turning on the charge transfer transistor in response to the gate-to-source voltage $V_{GS}$ falling below the threshold voltage Vt. The ferroelectric memory transfers the charge corresponding to the data of the memory cell to the capacitor from the bit line through the charge transfer transistor in this manner.

However, the ferroelectric memory disclosed in the aforementioned Japanese Patent Laying-Open No. 2002-133857 generates the voltage corresponding to the threshold voltage Vt applied to the gate of the charge transfer transistor through the threshold voltage of the p-channel transistor in the separately provided threshold voltage generation circuit when holding the charge transfer transistor in the OFF-state in the vicinity of the boundary state between ON- and OFF-states before reading the data. If the threshold voltage of the p-channel transistor in the threshold voltage generation circuit is dispersed due to dispersion in a manufacturing process, therefore, the threshold voltage generation circuit may disadvantageously generate a voltage different from the threshold voltage Vt of the charge transfer transistor. In this case, the gate-to-source voltage $V_{GS}$ of the charge transfer transistor resulting from the voltage received in the gate from the threshold voltage generation circuit is smaller or larger than the threshold voltage Vt, and hence the charge transfer transistor disadvantageously shifts to a state closer to an OFF-state or enters an ON-state from the OFF-state in the vicinity of the boundary state between ON- and OFF-states before the ferroelectric memory reads the data. If the charge transfer transistor shifts to the state closer to an OFF-state, therefore, the ferroelectric memory can only partially transfer the charge responsive to the data of the memory cell since the charge transfer transistor does not enter an ON-state until the potential of the bit line rises to a prescribed level despite the charge output from the memory cell to the bit line. If the charge transfer transistor enters an ON-state, on the other hand, a negative potential supplied from the capacitor to the bit line through the ON-state charge transfer transistor before the ferroelectric memory reads the data disadvantageously causes partial disappearance of the charge of the memory cell thereafter output to the bit line. Consequently, it is so difficult to sufficiently transfer the charge corresponding to the data held in the memory cell to the capacitor that a reading voltage is disadvantageously reduced in data reading.

SUMMARY OF THE INVENTION

The present invention has been proposed in order to solve the aforementioned problems, and an object of the present invention is to provide a memory capable of suppressing reduction of a reading voltage in data reading regardless of dispersion in a manufacturing process.

In order to attain the aforementioned object, a memory according to an aspect of the present invention comprises a memory cell connected to a bit line for holding data, charge storage means, a first field-effect transistor connected between the bit line and the charge storage means for controlling transfer of charge responsive to the data held in the memory cell from the bit line to the charge storage means and data determination means reading the data of the memory cell corresponding to a voltage resulting from the charge stored in the charge storage means. The memory sets the potential difference between a control terminal and a first remaining terminal of the first field-effect transistor through the threshold voltage of the first field-effect transistor to this threshold voltage for bringing the first field-effect transistor into an OFF-state in the vicinity of a boundary state between ON- and OFF-states.

As hereinabove described, the memory according to this aspect, provided with the first field-effect transistor controlling transfer of the charge responsive to the data held in the memory cell from the bit line to the charge storage means, can set the potential difference between the control terminal and the first remaining terminal of the first field-effect transistor to the threshold voltage of the first field-effect transistor through the threshold voltage of the first field-effect transistor itself by setting the potential difference between the control terminal and the first remaining terminal of the first field-effect transistor to the threshold voltage for bringing the first field-effect transistor into the OFF-state in the vicinity of the boundary state between ON- and OFF-states through the threshold voltage of the first field-effect transistor. Thus, the memory can correctly set the potential difference between the control terminal and the first remaining terminal of the first field-effect transistor to the threshold voltage of the first field-effect transistor. Therefore, the memory can suppress occurrence of such inconvenience that it is difficult to correctly set the potential difference between the control terminal and the first remaining terminal of the first field-effect transistor to the threshold voltage of the first field-effect transistor due to dispersion in a manufacturing process, dissimilarly to a case of setting the potential difference between the control terminal and the first remaining terminal of the first field-effect transistor to the threshold voltage of the first field-effect transistor through the threshold voltage of a transistor in a separately provided threshold voltage generation circuit. Thus, the memory can sufficiently transfer the charge responsive to the data of the memory cell from the bit line to the charge storage means through the first field-effect transistor regardless of dispersion in the manufacturing process. Consequently, the memory can suppress reduction of a reading voltage in data reading regardless of dispersion in the manufacturing process.

Further, the memory setting the potential difference between the control terminal and the first remaining terminal of the first field-effect transistor to the threshold voltage for bringing the first field-effect transistor into the OFF-state in the vicinity of the boundary state between ON- and OFF-states can turn on the first field-effect transistor due to the potential difference between the control terminal and the first remaining terminal of the first field-effect transistor falling below the threshold voltage of the first field-effect transistor when the first field-effect transistor is formed by a p-channel transistor and the memory raises the potential of the bit line by outputting positive charge responsive to the data of the memory cell to the bit line in data reading, for example. When transferring the positive charge from the bit line to the charge storage means and supplying negative charge from the charge storage means to the bit line through the first field-effect transistor at this time, the memory can inhibit the potential of the bit line from rising despite the positive charge output from the memory cell to the bit line. Thus, the memory can suppress occurrence of disturbance (disappearance of data resulting from deterioration of a polarization state) in another memory cell (nonselected cell) linked with the same bit line as the memory cell subjected to data reading when the memory cell is constituted of a ferroelectric capacitor.

In the memory according to the aforementioned aspect, the control terminal and a second remaining terminal of the first field-effect transistor are preferably connected with each other, and the memory preferably turns on the first field-effect transistor by changing the potential of the control terminal of the first field-effect transistor to a first potential rendering the absolute value of the potential difference between the control terminal and the first remaining terminal of the first field-effect transistor larger than the absolute value of the threshold voltage and thereafter turns off the first field-effect transistor by moving the charge through the first and second remaining terminals of the first field-effect transistor thereby raising or lowering the potential of the control terminal of the first field-effect transistor and bringing the potential of the control terminal of the first field-effect transistor to a second potential for equalizing the potential difference between the control terminal and the first remaining terminal of the first field-effect transistor to the threshold voltage. According to this structure, the memory, turning off the first field-effect transistor by bringing the potential of the control terminal of the first field-effect transistor to the second potential for equalizing the potential difference between the control terminal and the first remaining terminal of the first field-effect transistor to the threshold voltage not to further move the charge through the first and second remaining terminals of the first field-effect transistor, can inhibit the potential of the control terminal of the first field-effect transistor from going up or down. Thus, the memory can set the potential of the control terminal of the first field-effect transistor to the second potential. Consequently, the memory can easily set the potential difference between the control terminal and the first remaining terminal of the first field-effect transistor to the threshold voltage for bringing the first field-effect transistor into the OFF-state in the vicinity of the boundary state between ON- and OFF-states through the threshold voltage of the first field-effect transistor.

In this case, the control terminal of the first field-effect transistor is preferably the gate, the first remaining terminal of the first field-effect transistor is preferably the source, and the second remaining terminal of the first field-effect transistor is preferably the drain. According to this structure, the memory can set the potential difference (gate-to-source voltage $V_{GS}$) between the gate and the source of the first field-effect transistor to the threshold voltage for bringing the first field-effect transistor into the OFF-state in the vicinity of the boundary state between ON- and OFF-states through the threshold voltage of the first field-effect transistor.

In the aforementioned structure having the control terminal and the second remaining terminal of the first field-effect transistor connected with each other, the first remaining terminal of the first field-effect transistor is preferably connected to a third potential having an absolute value smaller than the absolute value of the second potential. According to this structure, the memory can easily raise or lower the potential of the control terminal of the first field-effect transistor toward the third potential by moving the charge toward the third potential through the first and second remaining terminals of the first field-effect transistor after turning on the first field-effect transistor by changing the potential of the control terminal of the first field-effect transistor to the first potential.

In the aforementioned structure having the first remaining terminal of the first field-effect transistor connected with the third potential, the memory preferably further comprises a second field-effect transistor connected between the first remaining terminal of the first field-effect transistor and the third potential. According to this structure, the memory can suppress inhibition of transfer of the charge responsive to the data of the memory cell from the bit line to the charge storage means through the first field-effect transistor despite the first remaining terminal connected to the third potential, by turning off the second field-effect transistor when transferring the charge responsive to the data of the memory cell from the bit line to the charge storage means through the first field-effect transistor.

In the aforementioned structure further comprising the second field-effect transistor, the memory preferably sets the potential of the control terminal of the first field-effect transistor to the second potential for equalizing the potential difference between the control terminal and the first remaining terminal of the first field-effect transistor to the threshold voltage and turning off the first field-effect transistor by turning on the first field-effect transistor by changing the potential of the control terminal of the first field-effect transistor to the first potential thereby moving the charge toward the third potential through the second field-effect transistor when the second field-effect transistor is in an ON-state. According to this structure, the memory can easily set the potential difference between the control terminal and the first remaining terminal of the first field-effect transistor to the threshold voltage for bringing the first field-effect transistor into the OFF-state in the vicinity of the boundary state between ON- and OFF-states.

In the aforementioned structure further comprising the second field-effect transistor, the bit line is preferably connected to the first remaining terminal of the first field-effect transistor, and the memory preferably turns off the second field-effect transistor when outputting the charge responsive to the data of the memory cell to the bit line. According to this structure, the memory can easily suppress inhibition of transfer of the charge responsive to the memory cell from the bit line to the charge storage means through the first field-effect transistor despite the first remaining terminal connected to the third potential.

In the aforementioned structure having the control terminal and the second remaining terminal of the first field-effect transistor connected with each other, the memory preferably further comprises a third field-effect transistor connected between the control terminal and the second remaining terminal of the first field-effect transistor for holding the potential difference between the control terminal and the first remaining terminal of the first field-effect transistor at least at the threshold voltage of the first field-effect transistor. According to this structure, the memory can hold the voltage between the control terminal and the first remaining terminal of the first field-effect transistor at least at the threshold voltage of the first field-effect transistor through the third field-effect transistor also when the potential of the first remaining terminal of the field-effect transistor goes up or down, by transferring the charge responsive to the data of the memory cell from the bit line to the charge storage means through the first field-effect transistor by turning on the first field-effect transistor after setting the voltage between the control terminal and the first remaining terminal of the first field-effect transistor to the threshold voltage. Thus, the memory can hold the first field-effect transistor in an ON-state, for sufficiently transferring the charge responsive to the data of the memory cell from the bit line to the capacitor through the first field-effect transistor.

In the aforementioned structure further comprising the third field-effect transistor, the first field-effect transistor and the third field-effect transistor are preferably of the same conductive type, and preferably have substantially identical threshold voltages. According to this structure, the memory can easily hold the voltage between the control terminal and the first remaining terminal of the first field-effect transistor at least at the threshold voltage of the first field-effect transistor through the third field-effect transistor.

In the memory according to the aforementioned-aspect, a first electrode of the charge storage means is preferably connected to the second remaining terminal of the first field-effect transistor, and the charge storage means preferably has a function of raising or lowering the potential of the second remaining terminal of the first field-effect transistor. According to this structure, the memory can easily transfer positive charge responsive to the data of the memory cell from the bit line to the charge storage means through the first field-effect transistor when outputting the positive charge responsive to the data of the memory cell to the bit line in data reading, by lowering the potential of the second remaining terminal of the first field-effect transistor to a negative level lower than the potential of the bit line connected to the first remaining terminal of the first field-effect transistor with the charge storage means before data reading. Further, the memory can transfer positive charge of a quantity responsive to negative charge output to the bit line from the charge storage means to the bit line through the first field-effect transistor when outputting the negative charge responsive to the data of the memory cell to the bit line in data reading, by raising the potential of the second remaining terminal of the first field-effect transistor to a level higher than the potential of the bit line connected to the first remaining terminal of the first field-effect transistor before data reading. Thus, the memory can easily associate a voltage resulting from the charge stored in the charge storage means with the data of the memory cell. In addition, the memory can raise or lower the potential of the second remaining terminal of the first field-effect transistor through the charge storage means, whereby neither positive voltage generation circuit nor negative voltage generation circuit may be provided in order to generate a voltage for raising or lowering the potential of the first remaining terminal of the first field-effect transistor. Thus, the memory can suppress increase of the circuit scale also when raising or lowering the potential of the first remaining terminal of the first field-effect transistor.

In this case, the charge storage means preferably includes a capacitor. According to this structure, the charge storage means can be easily formed to have the function of raising or lowering the second remaining terminal of the first field-effect transistor.

In the aforementioned having the charge storage means including the capacitor, a first electrode of the capacitor is preferably connected to the second remaining terminal of the first field-effect transistor, and the memory preferably raises or lowers the potential of the second remaining terminal of the first field-effect transistor by raising or lowering a potential applied to a second electrode of the capacitor. According to this structure, the memory can easily lower the potential of the second remaining terminal of the first field-effect transistor to a negative level lower than the potential of the bit line connected to the first remaining terminal of the first field-effect transistor with the capacitor before data reading when outputting positive charge responsive to the data of the memory cell to the bit line in data reading. Further, the memory can easily raise the potential of the second remaining terminal of the first field-effect transistor to a level higher than the potential of the bit line connected to the first remaining terminal of the first field-effect transistor with the capacitor before data reading when outputting negative charge responsive to the data of the memory cell to the bit line in data reading.

In the memory according to the aforementioned aspect, the first remaining terminal of the first field-effect transistor is preferably connected to the bit line, and the memory preferably changes the potential difference between the control terminal and the first remaining terminal of the first field-effect transistor by raising or lowering the potential of the bit line by outputting the charge responsive to the data of the memory cell to the bit line thereby raising or lowering the potential of the first remaining terminal of the first field-effect transistor for turning on the first field-effect transistor. According to this structure, the memory can easily read the data held in the memory through the first field-effect transistor.

In this case, the memory preferably sets the potential difference between the control terminal and the first remaining terminal of the first field-effect transistor to the threshold voltage for bringing the first field-effect transistor into the OFF-state in the vicinity of the boundary state between ON- and OFF-states before outputting the charge responsive to the data of the memory cell to the bit line. According to this structure, the memory can easily turn on the first field-effect transistor by raising or lowering the potential of the bit line when reading the data held in the memory cell.

In the memory according to the aforementioned aspect, the threshold voltage of the first field-effect transistor is substantially 0 V, and the memory preferably applies a voltage of substantially 0 V to the control terminal of the first field-effect transistor. According to this structure, the memory can set the potential difference between the control terminal and the first remaining terminal of the first field-effect transistor to the threshold voltage (0 V) for bringing the first field-effect transistor into the OFF-state in the vicinity of the boundary state between ON- and OFF-states by setting the potential of the first remaining terminal to 0 V. Thus, the memory can set the potential difference between the control terminal and the first remaining terminal of the first field-effect transistor to the threshold voltage of the first field-effect transistor with the generally employed potential (0 V).

In the memory according to the aforementioned aspect, the bit line is preferably connected to the first remaining terminal of the first field-effect transistor and the charge storage means is preferably connected to the second remaining terminal of the first field-effect transistor, while the memory preferably further comprises a voltage generation circuit connected to the second remaining terminal of the first field-effect transistor. According to this structure, the memory can easily lower the potential of the second remaining terminal of the first field-effect transistor to a negative level lower than the potential of the bit line connected to the first remaining terminal of the first field-effect transistor with the voltage generation circuit before data reading when outputting positive charge responsive to the data of the memory cell to the bit line in data reading. Further, the memory can easily raise the potential of the second remaining terminal of the first field-effect transistor to a level higher than the potential of the bit line connected to the first remaining terminal of the first field-effect transistor with the voltage generation circuit before data reading when outputting negative charge responsive to the data of the memory cell to the bit line in data reading. Thus, the memory can transfer the charge responsive to the data of the memory cell from the bit line to the charge storage means through the first field-effect transistor.

In this case, the memory preferably raises or lowers the potential of the second remaining terminal of the first field-effect transistor beyond the potential of the first remaining terminal of the first field-effect transistor with the voltage generation circuit before transferring the charge responsive to the data of the memory cell from the bit line to the charge storage means through the first field-effect transistor. According to this structure, the memory can easily transfer the charge responsive to the data of the memory cell from the bit line to the charge storage means through the first field-effect transistor.

In the aforementioned structure further comprising the voltage generation circuit, the memory preferably further comprises a fourth field-effect transistor connected between the second remaining terminal of the first field-effect transistor and the voltage generation circuit. According to this structure, the memory can change the potential of the second remaining terminal of the first field-effect transistor by turning on or off the fourth field-effect transistor.

In the aforementioned structure further comprising the fourth field-effect transistor, the memory preferably raises or lowers the potential of the second remaining terminal of the first field-effect transistor beyond the potential of the first remaining terminal of the first field-effect transistor with the voltage generation circuit by turning on the fourth field-effect transistor before transferring the charge responsive to the data of the memory cell from the bit line to the charge storage means through the first field-effect transistor. According to this structure, the memory can easily transfer the charge responsive to the data of the memory cell from the bit line to the charge storage means through the first field-effect transistor by turning on the fourth field-effect transistor before transferring the charge responsive to the data of the memory cell from the bit line to the charge storage means through the first field-effect transistor.

In the memory according to the aforementioned aspect, the memory cell is preferably formed by a ferroelectric capacitor. According to this structure, the memory (ferroelectric memory) including the memory cell formed by a ferroelectric capacitor can suppress reduction of a reading voltage in data reading regardless of dispersion in a manufacturing process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The circuit structure of a ferroelectric memory according to a first embodiment of the present invention is described with reference to FIG. 1.

Figure 1:
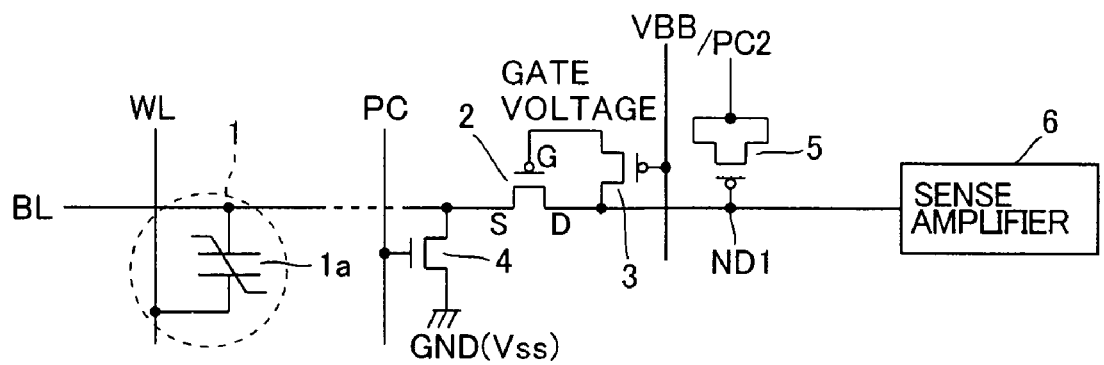
FIG. 1 is a circuit diagram showing the circuit structure of a ferroelectric memory according to a first embodiment of the present invention.

As shown in FIG. 1, the ferroelectric memory according to the first embodiment is constituted of a memory cell 1, two p-channel transistors 2 and 3, an n-channel transistor 4, a capacitor 5 and a sense amplifier 6. The p-channel transistor 2 is an example of the "first field-effect transistor" in the present invention, and the p-channel transistor 3 is an example of the "third field-effect transistor" in the present invention. The n-channel transistor 4 is an example of the "second field-effect transistor" in the present invention, and the capacitor 5 is an example of the "charge storage means" in the present invention.

The memory cell 1 is constituted of only a ferroelectric capacitor 1a arranged on a position where a word line WL and a bit line BL intersect with each other. The p-channel transistor 2 has a threshold voltage Vtp (<0). This p-channel transistor 2 is provided for controlling transfer of charge corresponding to data stored in the memory cell 1 from the bit line BL to the capacitor 5. The source of the p-channel transistor 2 is connected to the bit line BL. The drain and the gate of the p-channel transistor 2 are connected with each other through the p-channel transistor 3. The p-channel transistor 3 has the same threshold voltage Vtp (<0) as the p-channel transistor 2. This p-channel transistor 3 has a function of holding the absolute value of the gate-to-source voltage $V_{GS}$ of the p-channel transistor 2 at least at the absolute value of the threshold voltage Vtp also when the potential of the source of the p-channel transistor 2 goes up in transfer of the charge of the memory cell 1 from the bit line BL to the capacitor 5 through the source and the drain of the p-channel transistor 2. The p-channel transistor 3 is supplied with a negative voltage VBB (<2 Vtp), which is a constant voltage of not more than twice the aforementioned threshold voltage Vtp, in its gate. The source of the n-channel transistor 4 is connected with the source of the p-channel transistor 2, while the drain thereof is grounded. The n-channel transistor 4 receives a control signal PC in its gate.

The capacitor 5 is constituted of a p-channel transistor having a source and a drain connected with each other. A first electrode of this capacitor 5 is connected to the drain of the aforementioned p-channel transistor 2. The capacitor 5 receives another control signal /PC2 in its second electrode. Thus, the ferroelectric memory boots the potential of a node ND1 connected with the first electrode of the capacitor 5 for lowering the same through the capacitance of the capacitor 5 when lowering the potential of the control signal /PC2. The sense amplifier 6 is connected to the drain of the n-channel transistor 2. This sense amplifier 6 has a function of determining data by comparing the potential of the node ND1 resulting from charge stored in the capacitor 5 with a prescribed reference potential and raising or lowering the potential of the node ND1 when the ferroelectric memory reads the data from the memory cell 1.

A data read operation of the ferroelectric memory according to the first embodiment of the present invention is now described with reference to FIG. 2.

Figure 2:
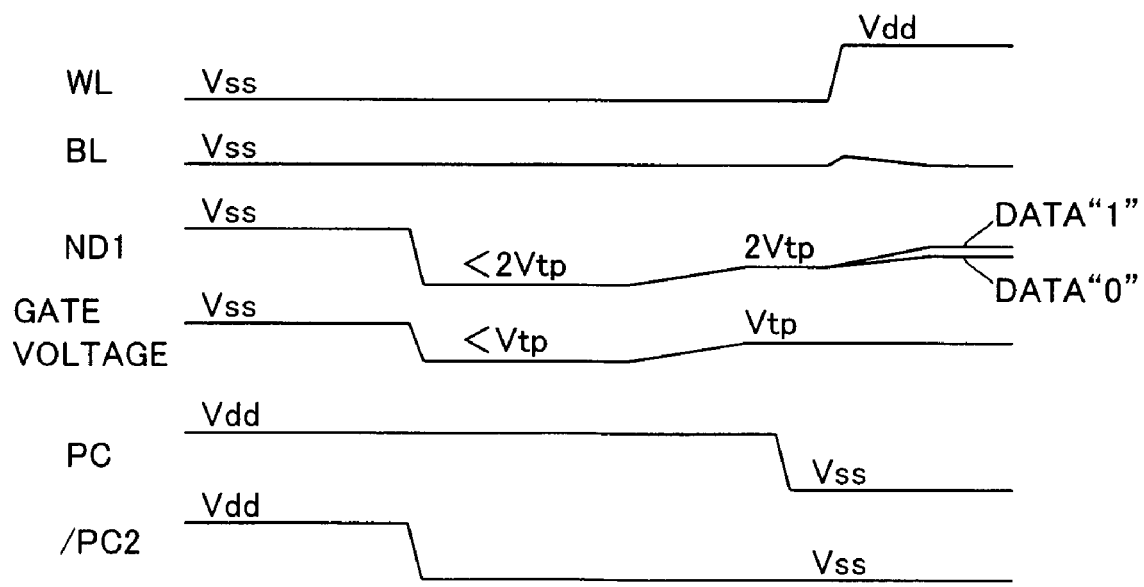
FIG. 2 is a voltage waveform diagram for illustrating a data read operation of the ferroelectric memory according to the first embodiment of the present invention.

In the ferroelectric memory according to the first embodiment, the potential of the word line WL is at Vss in an initial state of the data read operation, as shown in FIG. 2. The potential of the control signal PC is at Vdd. Thus, the n-channel transistor 4 is in an ON-state. Therefore, the ferroelectric memory supplies the ground potential (GND) to the bit line BL through the ON-state n-channel transistor 4, thereby setting the potential of the bit line BL to Vss (GND). Both of the gate potential of the p-channel transistor 2 and the potential of the node ND1 are at Vss. Thus, the gate-to-source voltage $V_{GS}$ of the p-channel transistor 2 is about 0 V (>Vtp), whereby the p-channel transistor 2 is in an OFF-state. Therefore, the node ND1 is in a floating state. The potential of the control signal /PC2 is at Vdd. The p-channel transistor 3 receives a negative voltage VBB set to a constant level of not more than 2 Vtp (Vtp: threshold voltage of the p-channel transistors 2 and 3) in its gate. Thus, the p-channel transistor 3 is in an ON-state.

Then, the ferroelectric memory according to the first embodiment lowers the potential of the control signal /PC2 input in the capacitor 5 from Vdd to Vss. Thus, the ferroelectric memory boots the potential of the floating node ND1 connected with the capacitor 5 for lowering the same through the capacitance of the capacitor 5. Therefore, the ferroelectric memory lowers the potential of the node ND1 from Vss to a negative level of not more than 2 Vtp (Vtp<0). Following this fall of the potential of the node ND1, the potential of the gate (gate voltage) of the p-channel transistor 2 linked with the node ND1 through the p-channel transistor 3 also goes down. At this time, the gate voltage of the p-channel transistor 2 goes down to a level higher than the negative potential (<2 Vtp) of the node ND1 by the absolute value of the threshold voltage Vtp of the p-channel transistor 3. In other words, the gate voltage of the p-channel transistor 2 goes down to the negative level of not more than Vtp, whereby the p-channel transistor 2 enters an ON-state. The ferroelectric memory supplies the ground potential (GND (Vss)) to the gate of the ON-state p-channel transistor 2 through the n-channel transistor 4, the source and the drain of the p-channel transistor 2 and the p-channel transistor 3. Thus, the gate voltage (<Vtp) of the p-channel transistor 2 goes up toward the ground potential (GND (Vss)).

According to the first embodiment, the gate-to-source voltage $V_{GS}$ of the p-channel transistor 2 reaches the threshold voltage Vtp when the gate voltage of the p-channel transistor 2 reaches the threshold voltage Vtp, to turn off the p-channel transistor 2. Thus, the ferroelectric memory stops raising the gate voltage of the p-channel transistor 2 at the threshold voltage Vtp. At this time, the ferroelectric memory holds the p-channel transistor 2 in an OFF-state in the vicinity of a boundary state between ON- and OFF-states. When the p-channel transistor 2 enters the ON-state, the potential of the node ND1 also goes up from the negative level of not more than 2 Vtp through the n-channel transistor 4 and the source and the drain of the p-channel transistor 2. When the gate voltage of the p-channel transistor 2 reaches the threshold voltage Vtp to turn off the p-channel transistor 2, the ferroelectric memory also stops raising the potential of the node ND1. At this time, the potential of the node ND1 is 2 Vtp.

Thereafter the ferroelectric memory lowers the potential of the control signal PC from Vdd to Vss. Thus, the n-channel transistor 4 enters an OFF-state. At this time, the bit line BL enters a floating state since the p-channel transistor 2 is also in an OFF-state. Thereafter the ferroelectric memory raises the potential of the word line WL to Vdd. Thus, the ferroelectric memory emits charge responsive to the data held in the ferroelectric capacitor 1a of the memory cell 1 to the bit line BL. Therefore, the potential of the bit line BL starts to go up. When the potential of the bit line BL slightly goes up at this time, the gate-to-source voltage $V_{GS}$ of the p-channel transistor 2 falls below the threshold voltage Vtp of the p-channel transistor 2, to turn on the p-channel transistor 2. Thus, the ferroelectric memory transfers the charge emitted from the ferroelectric capacitor 1a to the bit line BL through the p-channel transistor 2 and introduces the same into the capacitor 5. Therefore, the potential of the node ND1 connected with the capacitor 5 goes up from 2 Vtp. On the other hand, the ferroelectric memory cancels the slight rise of the potential of the bit line BL from Vss through the negative potential of the node ND1 supplied through the p-channel transistor 2, to gradually lower the potential of the bit line BL. Consequently, the potential of the bit line BL hardly goes up beyond Vss.

The quantity of the charge emitted from the ferroelectric capacitor 1a to the bit line BL depends on whether the memory cell 1 holds data "0" or "1". If the memory cell 1 holds the data "0", the quantity of the charge emitted to the bit line BL is smaller than that emitted when the memory cell 1 holds the data "1". When the memory cell 1 holds the data "0", therefore, the potential of the node ND1 goes up from 2 Vtp by a quantity smaller than that in the case where the memory cell 1 holds the data "1". Thereafter the sense amplifier 6 compares the potential of the node ND1 with the reference potential. The reference potential is set between the potentials of the node ND1 corresponding to the data "0" and "1" respectively. The sense amplifier 6 amplifies the difference between the potential of the node ND1 and the reference potential, and determines the data read from the memory cell 1 as "0" or "1". If the memory cell 1 has held the data "0", the sense amplifier 6 lowers the potential of the node ND1 and raises the reference potential. If the memory cell 1 has held the data "1", on the other hand, the sense amplifier 6 raises the potential of the node ND1 and lowers the reference potential. The ferroelectric memory according to the first embodiment reads the data in the aforementioned manner.

According to the first embodiment, as hereinabove described, the ferroelectric memory provided with the p-channel transistor 2 controlling transfer of the charge responsive to the data held in the memory cell 1 from the bit line BL to the capacitor 5 can set the gate-to-source voltage $V_{GS}$ of the p-channel transistor 2 to the threshold voltage Vtp of the p-channel transistor 2 through the threshold voltage Vtp of the p-channel transistor 2 itself by lowering the gate voltage of the p-channel transistor 2 to not more than the threshold voltage Vtp of the p-channel transistor 2 thereby turning on the p-channel transistor 2 and thereafter raising the gate voltage of the p-channel transistor 2 to the threshold voltage Vtp by moving the charge through the source and the drain of the p-channel transistor 2 thereby turning off the p-channel transistor 2. Thus, the ferroelectric memory can correctly set the gate-to-source voltage $V_{GS}$ of the p-channel transistor 2 to the threshold voltage Vtp of the p-channel transistor 2. Therefore, the ferroelectric memory can suppress occurrence of such inconvenience that it is difficult to correctly set the gate-to-source voltage $V_{GS}$ of the p-channel transistor 2 to the threshold voltage Vtp of the p-channel transistor 2 due to dispersion in the manufacturing process, dissimilarly to a case of setting the gate-to-source voltage $V_{GS}$ of the p-channel transistor 2 to the threshold voltage Vtp through the threshold voltage of a transistor in a separately provided threshold voltage generation circuit. Thus, the ferroelectric capacitor can sufficiently transfer the charge responsive to the data of the memory cell 1 to the capacitor 5 through the p-channel transistor 2 regardless of dispersion in the manufacturing process. Consequently, the ferroelectric capacitor can suppress reduction of a reading voltage in data reading regardless of dispersion in the manufacturing process.

According to the first embodiment, the ferroelectric capacitor setting the gate-to-source voltage $V_{GS}$ of the p-channel transistor 2 to the threshold voltage Vtp for bringing the p-channel transistor 2 into the OFF-state in the vicinity of the boundary state between ON- and OFF-states can turn on the p-channel transistor 2 by lowering the gate-to-source voltage $V_{GS}$ of the p-channel transistor 2 to not more than the threshold voltage Vtp of the p-channel transistor 2 when outputting positive charge responsive to the data of the memory cell 1 to the bit line BL and raising the potential of the bit line BL in data reading. At this time, the ferroelectric memory can suppress the positive charge output from the memory cell 1 from raising the potential of the bit line BL by transferring the positive charge from the bit line BL to the capacitor 5 and supplying negative charge from the capacitor 5 to the bit line BL through the p-channel transistor 2. Thus, the ferroelectric memory can suppress occurrence of disturbance (disappearance of data resulting from deterioration of a polarization state) caused by application of the raised potential of the bit line BL to a ferroelectric capacitor 1a of another memory cell 1 linked with the same bit line BL as the memory cell 1 subjected to data reading.

According to the first embodiment, the ferroelectric memory can lower the potential of the drain of the p-channel transistor 2 to a negative level lower than the potential of the bit line BL connected to the source of the p-channel transistor 2 through the capacitor 5 before data reading when outputting positive charge responsive to the data of the memory cell 1 to the bit line BL in data reading by connecting the first electrode of the capacitor 5 to the drain of the p-channel transistor 2 and booting the potential of the drain of the p-channel transistor 5 for lowering the same through the capacitor 5. Therefore, the ferroelectric memory can easily transfer the positive charge responsive to the data of the memory cell 1 from the bit line BL to the capacitor 5 through the p-channel transistor 2 in data reading. Thus, the ferroelectric capacitor can easily associate the voltage of the node ND1 resulting from the charge stored in the capacitor 5 with the data of the memory cell 1.

Second Embodiment

Figure 3:
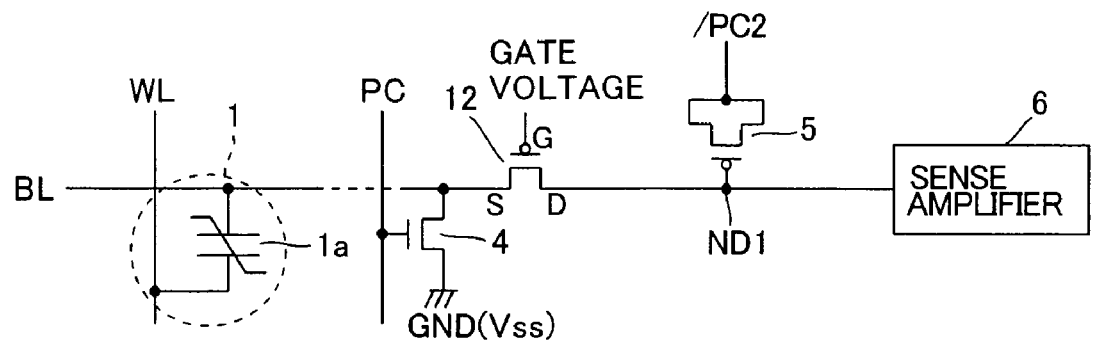
FIG. 3 is a circuit diagram showing the circuit structure of a ferroelectric memory according to a second embodiment of the present invention.

The circuit structure of a ferroelectric memory according to a second embodiment of the present invention is described with reference to FIG. 3.

The ferroelectric memory according to the second embodiment applies a potential Vss (GND (0 V)) to the gate of a p-channel transistor 12 connected between a bit line BL and a capacitor 5 and a sense amplifier 6, dissimilarly to the ferroelectric memory according to the aforementioned first embodiment. The threshold voltage Vtp0 of the p-channel transistor 12 is set to substantially 0 V. According to the second embodiment, the gate of the p-channel transistor 12 is not connected to a node ND1 connected with the capacitor 5, and the ferroelectric memory is provided with no p-channel transistor 3 corresponding to that connected between the node ND1 and the gate of the p-channel transistor 2 in the ferroelectric memory according to the first embodiment shown in FIG. 1. The remaining structure of the ferroelectric memory according to the second embodiment is similar to that of the ferroelectric memory according to the aforementioned first embodiment.

A data read operation of the ferroelectric memory according to the second embodiment is now described with reference to FIGS. 3 and 4.

Figure 4:
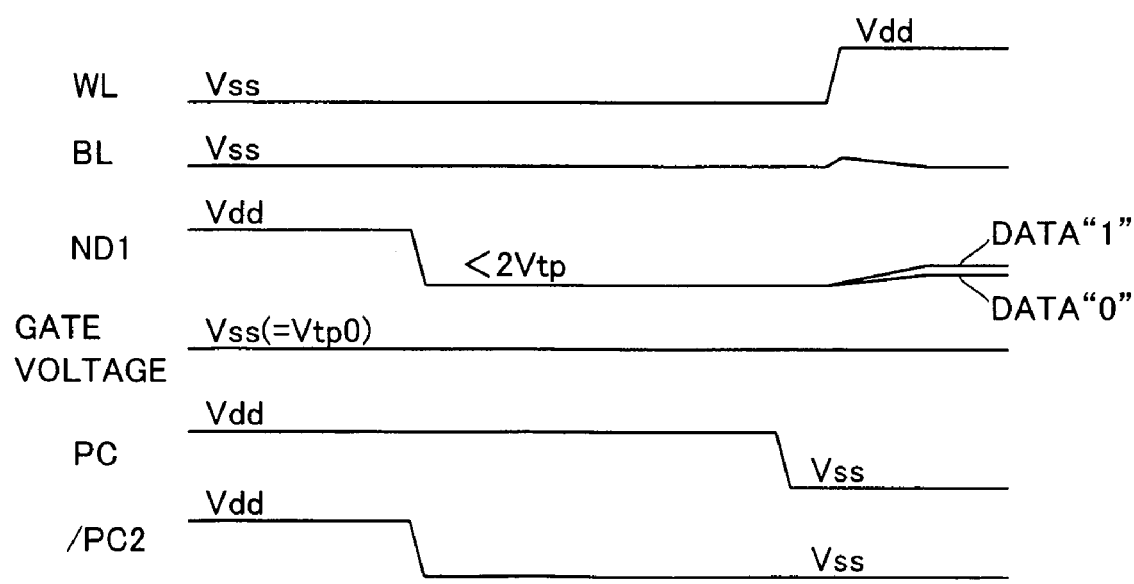
FIG. 4 is a voltage waveform diagram for illustrating a data read operation of the ferroelectric memory according to the second embodiment of the present invention.

In the ferroelectric memory according to the second embodiment, the potential of a word line WL is at Vss in an initial state of the data read operation, as shown in FIG. 4. The potential of a control signal PC is at Vdd. Thus, an n-channel transistor 4 is in an ON-state. Therefore, the potential of the bit line BL supplied with the ground potential (GND) through the n-channel transistor 4 is at Vss (GND).

According to the second embodiment, the ferroelectric memory applies the potential Vss (GND (0 V)) to the gate of the p-channel transistor 12 in the initial state. Thus, the ferroelectric memory holds the p-channel transistor 12 in an OFF-state in the vicinity of a boundary state between ON- and OFF-states due to the threshold voltage Vtp0 of the p-channel transistor 12 set to substantially 0 V. The node ND1 is in a floating state due to the OFF-state of the p-channel transistor 12. The potential of a control signal /PC2 is at Vdd.

According to the second embodiment, the ferroelectric memory lowers the potential of the control signal /PC2 input in the capacitor 5 from Vdd to Vss. Thus, the ferroelectric memory boots the potential of the floating node ND1 connected with the capacitor 5 for lowering the same through the capacitance of the capacitor 5. The ferroelectric memory lowers the potential of the node ND1 from Vss to a negative level of not more than 2 Vtp (Vtp<0). At this time, the ferroelectric memory holds the gate-to-source voltage $V_{GS}$ of the p-channel transistor 12 at 0 V by applying the potential fixed to Vss to the gate of the p-channel transistor 12 while supplying the ground potential (GND (Vss)) to the source thereof through the n-channel transistor 4. Thus, the ferroelectric memory maintains the p-channel transistor 12 in the OFF-state in the vicinity of the boundary state between ON- and OFF-states.

Thereafter the ferroelectric memory lowers the potential of the control signal PC from Vdd to Vss, thereby turning off the n-channel transistor 4. At this time, the bit line BL enters a floating state since the p-channel transistor 12 is also in an OFF-state. Thereafter the ferroelectric memory raises the potential of the word line WL to Vdd. Thus, the ferroelectric memory emits charge responsive to data held in a ferroelectric capacitor 1a of a memory cell 1 to the bit line BL. Therefore, the potential of the bit line BL starts to go up. When the potential of the bit line BL slightly goes up, the gate-to-source voltage $V_{GS}$ of the p-channel transistor 12 falls below the threshold voltage Vtp0 (=0 V) of the p-channel transistor 12, to turn on the p-channel transistor 12. Thus, the ferroelectric memory transfers the charge emitted from the ferroelectric capacitor 1a to the bit line BL through the p-channel transistor 12 and introduces the same into the capacitor 5. Therefore, the potential of the node ND1 connected with the capacitor 5 goes up from the negative level of not more than 2 Vtp. On the other hand, the ferroelectric memory cancels the slight rise of the potential of the bit line BL from Vss through the negative potential of the node ND1 supplied through the p-channel transistor 12, to gradually lower the potential of the bit line BL. Consequently, the potential of the bit line BL hardly goes up beyond Vss.

Thereafter the sense amplifier 6 amplifies the difference between the potential of the node ND1 resulting from the charge transferred from the ferroelectric capacitor 1a and stored in the capacitor 5 and a reference potential, and determines data read from the memory cell 1 as "0" or "1" similarly to the aforementioned first embodiment. The ferroelectric memory according to the second embodiment reads the data in the aforementioned manner.

According to the second embodiment, as hereinabove described, the ferroelectric memory can lower the potential of the node ND1 connected with either the source or the drain of the p-channel transistor 12 to the negative level (<2 Vtp) lower than the potential (Vss) of the bit line BL through the capacitor 5 before data reading, whereby no negative voltage generation circuit may be separately provided for generating a voltage for lowering the potential of the node ND1 to the negative level lower than the potential (Vss) of the bit line BL. Thus, the ferroelectric memory can suppress increase of the circuit scale thereof also when lowering the potential of the node ND1 to the negative level lower than the potential (Vss) of the bit line BL before data reading.

According to the second embodiment, the ferroelectric memory employing the p-channel transistor 12 having the threshold voltage Vtp0 of Vss (0 V) for controlling transfer of charge responsive to the data of the memory cell 1 from the bit line BL to the capacitor 5 can set the can set the gate-to-source voltage $V_{GS}$ of the p-channel transistor 12 to the threshold voltage Vtp0 (0 V) of the p-channel transistor 12 for bringing the p-channel transistor 12 into the OFF-state in the vicinity of the boundary state between ON- and OFF-states by setting the potential of the source of the p-channel transistor 12 linked with the bit line BL to Vss before data reading and applying the potential Vss to the gate of the p-channel transistor 12. Thus, the ferroelectric memory can set the gate-to-source voltage $V_{GS}$ of the p-channel transistor 12 to the threshold voltage Vtp0 of the p-channel transistor 12 with the generally employed potential Vss (GND), whereby no negative voltage generation circuit may be separately provided for generating a negative voltage, dissimilarly to a case of applying a negative voltage to the gate of a p-channel transistor having a negative threshold voltage for controlling transfer of the charge from the bit line BL to the capacitor 5 thereby setting the gate-to-source voltage $V_{GS}$ to the threshold voltage of the p-channel transistor, for example. Therefore, the ferroelectric memory can set the gate-to-source voltage $V_{GS}$ of the p-channel transistor 12 to the threshold voltage Vtp0 of the p-channel transistor 12 without increasing the circuit scale thereof.

In addition to the above, the ferroelectric memory according to the second embodiment can attain effects similar to those of the aforementioned first embodiment such as suppression of reduction of a reading voltage in data reading.

Third Embodiment

Figure 5:
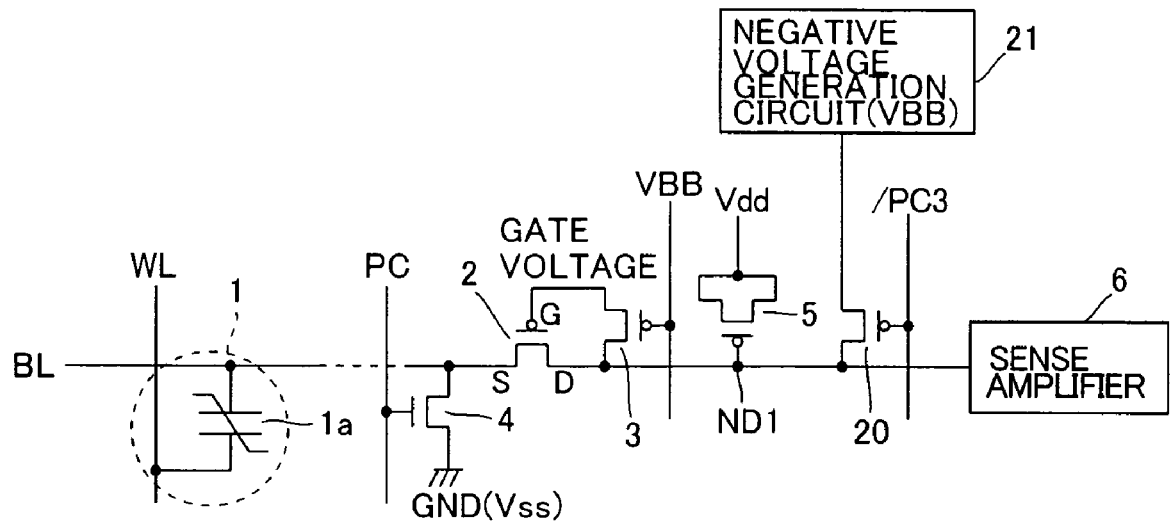
FIG. 5 is a circuit diagram showing the circuit structure of a ferroelectric memory according to a third embodiment of the present invention.

The circuit structure of a ferroelectric memory according to a third embodiment of the present invention is described with reference to FIG. 5.

The ferroelectric memory according to the third embodiment applies a negative voltage VBB generated by a separately provided negative voltage generation circuit 21 to a node ND1 instead of generating a negative voltage on the node ND1 by a boot operation through a capacitor 5, dissimilarly to the aforementioned first embodiment. More specifically, either the source or the drain of a p-channel transistor 20 is connected to the node ND1 connected with the capacitor 5 in the ferroelectric memory according to the third embodiment, as shown in FIG. 5. Either the drain or the source of the p-channel transistor 20 is supplied with the negative voltage VBB generated by the separately provided negative voltage generation circuit 21. The p-channel transistor 20 and the negative voltage generation circuit 21 are examples of the "fourth field-effect transistor" and the "voltage generation circuit" in the present invention respectively. According to the third embodiment, the negative voltage VBB is at a constant voltage of not more than 3 Vtp (Vtp: threshold voltage of p-channel transistors 2, 3 and 20) dissimilarly to that in the aforementioned first embodiment. The ferroelectric memory applies this negative voltage VBB also to the gate of the p-channel transistor 3 connected between the node ND1 and the gate of the p-channel transistor 2. The ferroelectric memory inputs a control signal /PC3 in the gate of the p-channel transistor 20. Thus, the ferroelectric memory applies the negative voltage VBB generated by the negative voltage generation circuit 21 to the node ND1 through the p-channel transistor 20 turned on in response to the control signal /PC3. A voltage applied to a first electrode of the capacitor 5 is fixed to Vdd. The remaining structure of the ferroelectric memory according to the third embodiment is similar to that of the ferroelectric memory according to the aforementioned first embodiment.

A data read operation of the ferroelectric memory according to the third embodiment is now described with reference to FIGS. 5 and 6.

Figure 6:
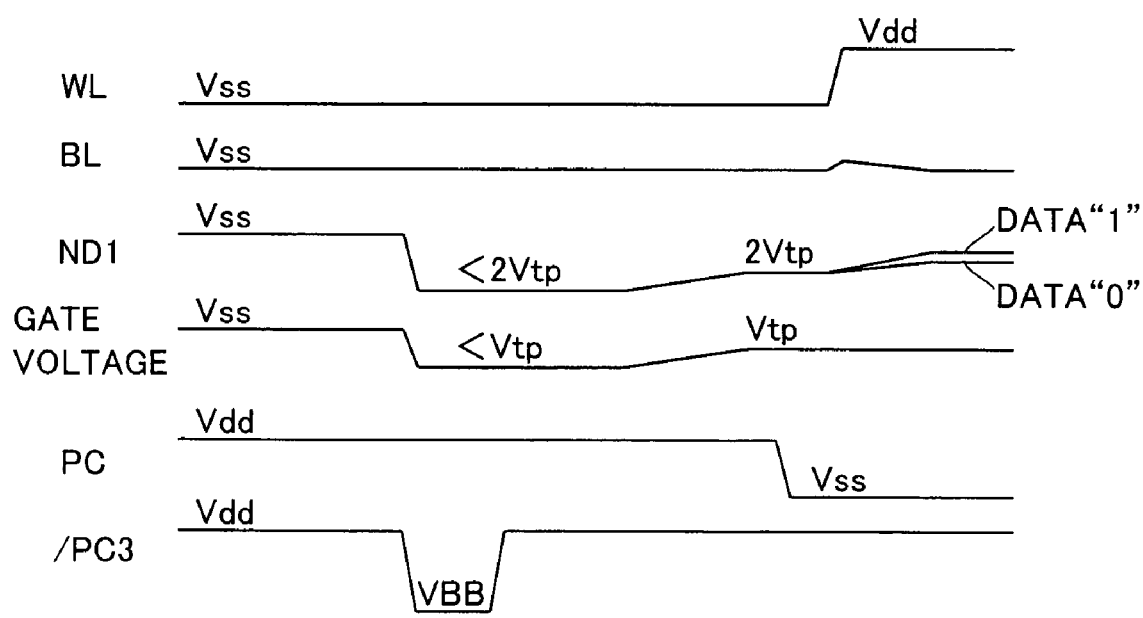
FIG. 6 is a voltage waveform diagram for illustrating a data read operation of the ferroelectric memory according to the third embodiment of the present invention.

In the ferroelectric memory according to the third embodiment, the potential of a word line WL is at Vss in an initial state of the data read operation, as shown in FIG. 6. The potential of a control signal PC is at Vdd. Thus, an n-channel transistor 4 is in an ON-state. Therefore, the ferroelectric memory supplies the ground potential (GND) to a bit line BL through the n-channel transistor 4, thereby setting the potential of the bit line BL to Vss (GND). Both of the gate voltage of the p-channel transistor 2 and the potential of the node ND1 are at Vss. At this time, the gate-to-source voltage $V_{GS}$ of the p-channel transistor 2 is about 0 V (>Vtp), whereby the p-channel transistor 2 is in an OFF-state. Further, the potential of the control signal /PC3 input in the gate of the p-channel transistor 20 is at Vdd, whereby the p-channel transistor 20 is in an OFF-state. Therefore, the node ND1 is in a floating state. The ferroelectric memory inputs the negative voltage VBB generated by the negative voltage generation circuit 21 in the gate of the p-channel transistor 3 and the drain of the p-channel transistor 20 respectively. This negative voltage VBB is set at the constant level of not more than 3 Vtp (Vtp: threshold voltage of the p-channel transistors 2, 3 and 20). Thus, the p-channel transistor 3 is in an ON-state.

According to the third embodiment, the ferroelectric memory lowers the potential of the control signal /PC3 input in the gate of the p-channel transistor 20 from Vdd to VBB (<3 Vtp). Thus, the ferroelectric memory turns on the p-channel transistor 20 for supplying a negative potential to the node ND1 through the p-channel transistor 20. Thus, the ferroelectric memory charges the capacitor 5 and lowers the potential of the node ND1 fro Vss. At this time, the ferroelectric memory lowers the potential of the node ND1 only to a voltage higher than the negative voltage VBB (<3 Vtp) supplied to the p-channel transistor 20 by the absolute value of the threshold voltage Vtp of the p-channel transistor 20. Therefore, the ferroelectric memory lowers the potential of the node ND1 from Vss to a negative level of not more than 2 Vtp.

Following this fall of the potential of the node ND1, the potential of the gate (gate voltage) of the p-channel transistor 2 linked with the node ND1 through the p-channel transistor 3 also goes down. At this time, the gate voltage of the p-channel transistor 2 goes down only to a voltage higher than the negative potential (<2 Vtp) of the node ND1 by the absolute value of the threshold voltage Vtp of the p-channel transistor 3. Thus, the gate voltage of the p-channel transistor 2 goes down to a negative level of not more than Vtp. At this time, the p-channel transistor 2 enters an ON-state. Thereafter the ferroelectric memory raises the potential of the control signal/PC3 from VBB to Vdd. Thus, the p-channel transistor 20 enters an OFF-state. The ferroelectric memory supplies the ground potential (GND) to the gate of the ON-state p-channel transistor 2 through the n-channel transistor 4, the source and the drain of the p-channel transistor 2 and the p-channel transistor 3. Thus, the gate voltage (<Vtp) of the p-channel transistor 2 goes up toward the ground potential (GND (Vss)).

According to the third embodiment, the ferroelectric memory turns off the p-channel transistor 2 when the gate voltage thereof reaches the threshold voltage Vtp. Thus, the ferroelectric memory stops raising the gate voltage of the p-channel transistor 2 at the threshold voltage Vtp. At this time, the ferroelectric memory holds the p-channel transistor 2 in an OFF-state in the vicinity of a boundary state between ON- and OFF-states. When the p-channel transistor 2 enters the ON-state, the potential of the node ND1 also goes up from the negative level of not more than 2 Vtp through the n-channel transistor 4 and the source and the drain of the p-channel transistor 2. When the gate voltage of the p-channel transistor 2 reaches the threshold voltage Vtp to turn off the p-channel transistor 2, the ferroelectric memory also stops raising the potential of the node ND1. At this time, the potential of the node ND1 is 2 Vtp.

Thereafter the ferroelectric memory lowers the potential of the control signal PC from Vdd to Vss, thereby turning off the n-channel transistor 4. At this time, the bit line BL enters a floating state since the p-channel transistor 2 is also in an OFF-state. Thereafter the ferroelectric memory raises the potential of the word line WL from Vss to Vdd thereby comparing a potential generated on the node ND1 with a reference potential with a sense amplifier 6 and determining data "0" or "1". At this time, the ferroelectric memory according to the third embodiment operates similarly to the ferroelectric memory according to the aforementioned first embodiment. The ferroelectric memory according to the third embodiment reads the data in the aforementioned manner.

The ferroelectric memory according to the third embodiment can attain effects similar to those of the aforementioned first embodiment such as suppression of reduction of a reading voltage in data reading regardless of dispersion in a manufacturing process.

Fourth Embodiment

The circuit structure of a ferroelectric memory according to a fourth embodiment of the present invention is described with reference to FIG. 7.

Figure 7:
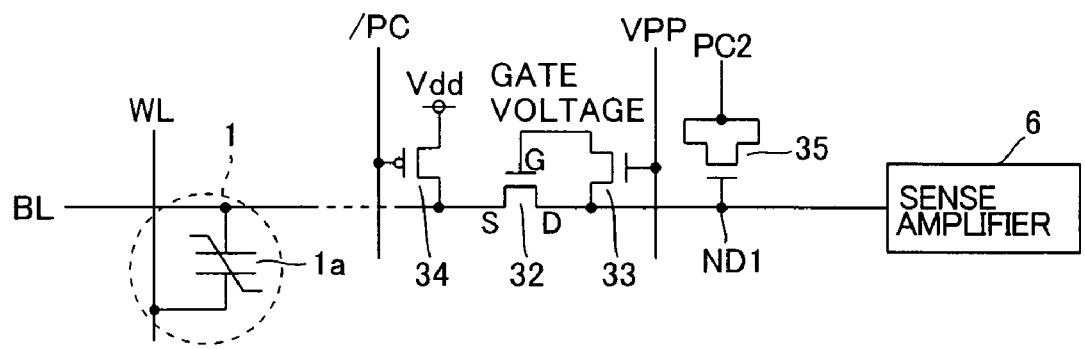
FIG. 7 is a circuit diagram showing the circuit structure of a ferroelectric memory according to a fourth embodiment of the present invention.

As shown in FIG. 7, the ferroelectric memory according to the fourth embodiment has a circuit structure obtained by replacing the p-channel transistors 2 and 3, the n-channel transistor 4 and the capacitor 5, formed by the p-channel transistor having the source and the drain connected with each other, of the ferroelectric memory according to the aforementioned first embodiment shown in FIG. 1 with n-channel transistors 32 and 33, a p-channel transistor 34 and a capacitor 35, formed by an n-channel transistor having a source and a drain connected with each other, respectively. The n-channel transistor 32 is an example of the "first field-effect transistor" in the present invention, and the n-channel transistor 33 is an example of the "third field-effect transistor" in the present invention. The p-channel transistor 34 is an example of the "second field-effect transistor" in the present invention, and the capacitor 35 is an example of the "charge storage means" in the present invention. The ferroelectric memory according to the fourth embodiment inputs a positive voltage VPP set to a constant level of at least Vdd+2 Vtn (Vtn: threshold voltage of the n-channel transistors 32 and 33) in the gate of the n-channel transistor 33. Further, the ferroelectric memory supplies the potential Vdd to the source of the p-channel transistor 34, and inputs a control signal /PC in the gate thereof. In addition, the ferroelectric memory inputs a control signal PC2 in an electrode of the capacitor 35 opposite to that connected to a node ND1. The remaining structure of the ferroelectric memory according to the fourth embodiment is similar to that of the ferroelectric memory according to the aforementioned first embodiment.

A data read operation of the ferroelectric memory according to the fourth embodiment of the present invention is now described with reference to FIGS. 7 and 8.

Figure 8:
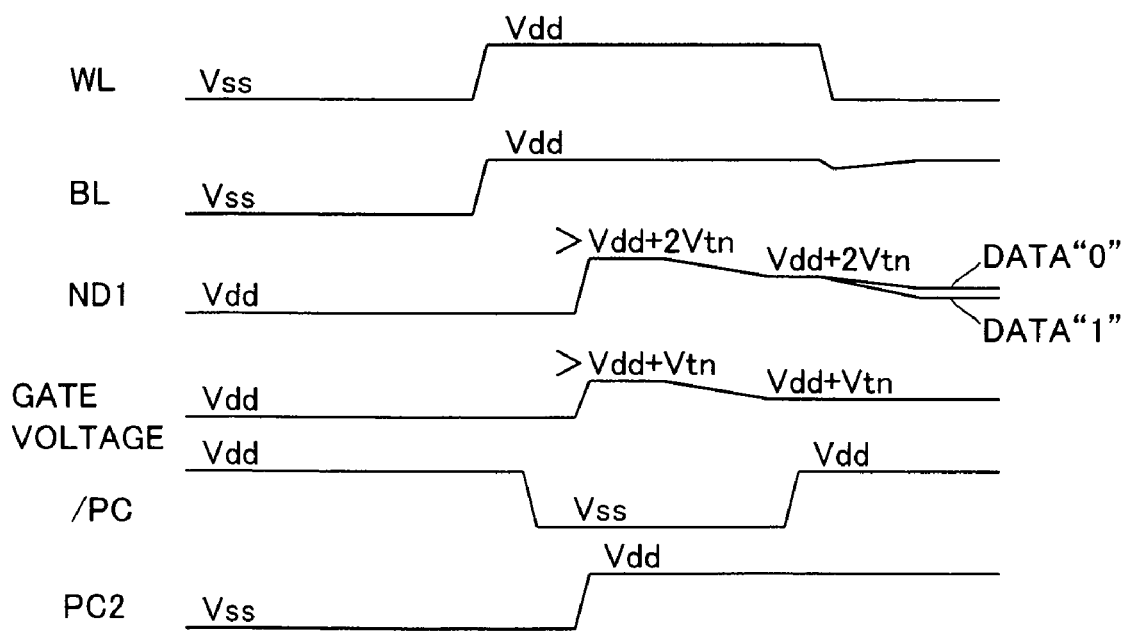
FIG. 8 is a voltage waveform diagram for illustrating a data read operation of the ferroelectric memory according to the fourth embodiment of the present invention.

In the ferroelectric memory according to the fourth embodiment, both of the potentials of a word line WL and a bit line BL are at Vss in an initial state of the data read operation, as shown in FIG. 8. The potential of the control signal /PC is at Vdd. Thus, the p-channel transistor 34 is in an OFF-state. Both of the gate voltage of the n-channel transistor 32 and the potential of the node ND1 are at Vdd. At this time, the gate-to-source voltage $V_{GS}$ of the n-channel transistor 32 is at about 0 V, whereby the n-channel transistor 32 is in an OFF-state. Therefore, the node ND1 is in a floating state. The potential of the control signal PC2 is at Vss. The ferroelectric memory inputs the positive voltage VPP set to the constant level of at least Vdd+2 Vtn (Vtn: threshold voltage of the n-channel transistors 32 and 33) in the gate of the n-channel transistor 33. Thus, the n-channel transistor 33 is in an ON-state.

Then, the ferroelectric memory simultaneously raises the potentials of the word line WL and the bit line BL to Vdd. At this time, the ferroelectric memory holds the potential difference between two electrodes of a ferroelectric capacitor 1a of a memory cell 1 at Vss (0 V), to read no data (output no charge) from the ferroelectric capacitor 1a to the bit line BL. Thereafter the ferroelectric memory lowers the potential of the control signal /PC to Vss. Thus, the ferroelectric memory turns on the p-channel transistor 34, thereby supplying the potential Vdd to the bit line BL through the p-channel transistor 34. Thus, the ferroelectric memory holds the potential of the bit line BL at Vdd.

According to the fourth embodiment, the ferroelectric memory raises the potential of the control signal PC2 input in the capacitor 35 from Vss to Vdd. Thus, the ferroelectric memory boots the potential of the floating node ND1 connected with the capacitor 35 for raising the same through the capacitance of the capacitor 35. Therefore, the ferroelectric memory raises the potential of the node ND1 from Vdd to a higher level of at least Vdd+2 Vtn. Following this rise of the potential of the node ND1, the potential of the gate (gate voltage) of the n-channel transistor 32 linked with the node ND1 through the n-channel transistor 33 also goes up. At this time, the gate voltage of the n-channel transistor 32 goes up only to a level lower than the potential (>Vdd+2 Vtn) of the node ND1 by the threshold voltage Vtn of the n-channel transistor 33. In other words, the gate voltage of the n-channel transistor 32 goes up to a level of at least Vdd+Vtn. At this time, the n-channel transistor 32 enters an ON-state. The ferroelectric memory supplies the potential Vdd to the ON-state n-channel transistor 32 through the p-channel transistor 34, the source and the drain of the n-channel transistor 32 and the p-channel transistor 33. Thus, the gate voltage (>Vdd+Vtn) of the n-channel transistor 32 goes down toward Vdd.

According to the fourth embodiment, the gate-to-source voltage $V_{GS}$ of the n-channel transistor 32 reaches the threshold voltage Vtn of the n-channel transistor 32 when the gate voltage thereof reaches Vdd+Vtn, to turn off the n-channel transistor 32. Thus, the ferroelectric memory stops lowering the gate voltage of the n-channel transistor 32 when the gate voltage goes down to Vdd+Vtn. At this time, the ferroelectric memory holds the n-channel transistor 32 in an OFF-state in the vicinity of a boundary state between ON- and OFF-states. When the n-channel transistor 32 enters the ON-state, the potential of the node ND1 also goes down from the level of at least Vdd+2 Vtn through the p-channel transistor 34 and the source and the drain of the n-channel transistor 32. When the gate voltage of the n-channel transistor 32 reaches the threshold voltage Vtn to turn off the n-channel transistor 32, the ferroelectric memory also stops lowering the potential of the node ND1. At this time, the potential of the node ND1 is Vdd+2 Vtn.

Thereafter the ferroelectric memory raises the potential of the control signal /PC from Vss to Vdd, thereby turning off the p-channel transistor 34. At this time, the bit line BL enters a floating state since the n-channel transistor 32 is also in an OFF-state. Thereafter the ferroelectric memory lowers the potential of the word line WL to Vss. Thus, current flows from the bit line BL to the word line WL, whereby the ferroelectric capacitor 1a outputs negative charge of a quantity corresponding to data stored in the memory cell 1 to the bit line BL. Therefore, the potential of the bit line BL starts going down from Vdd. When the potential of the bit line BL slightly goes down, the gate-to-source voltage $V_{GS}$ of the n-channel transistor 32 exceeds the threshold voltage Vtn of the n-channel transistor 32, to turn on the n-channel transistor 32. Thus, the ferroelectric memory transfers the negative charge output from the ferroelectric capacitor 1a to the bit line BL toward the node ND1 through the n-channel transistor 32. Therefore, the potential of the node ND1 connected with the capacitor 35 goes down from Vdd+2 Vtn. On the other hand, the ferroelectric memory cancels the slight fall of the potential of the bit line BL from Vdd by supplying positive charge from the node N1 through the n-channel transistor 32, to gradually raise the potential of the bit line BL. Consequently, the potential of the bit line BL hardly goes down beyond Vdd.

The quantity of the charge supplied from the node ND1 to the bit line BL depends on whether the memory cell 1 stores data "0" or "1". If the memory cell 1 stores the data "0", the quantity of charge supplied from the node ND1 to the bit line BL is smaller than that supplied when the memory cell 1 stores the data "1". When the memory cell 1 stores the data "0", therefore, the potential of the node ND1 goes down from Vdd+2 Vtn by a quantity smaller than that in the case where the memory cell 1 stores the data "1". Thereafter the sense amplifier 6 compares the potential of the node ND1 with a reference potential, which is set between the potentials of the node ND1 corresponding to the data "0" and "1" respectively. Then, the sense amplifier 6 amplifies the difference between the potential of the node ND1 and the reference potential, and determines the data read from the memory cell 1 as "0" or "1". If the memory cell 1 has stored the data "0", the sense amplifier 6 raises the potential of the node ND1 and lowers the reference potential. If the memory cell 1 has stored the data "1", on the other hand, the sense amplifier 6 lowers the potential of the node ND1 and raises the reference potential. The ferroelectric memory according to the fourth embodiment reads the data in the aforementioned manner.

According to the fourth embodiment, as hereinabove described, the ferroelectric memory provided with the n-channel transistor 32 controlling transfer of charge responsive to the data held in the memory cell 1 from the capacitor 35 to the bit line BL can set the gate-to-source voltage $V_{GS}$ of the n-channel transistor 32 to the threshold voltage Vtn of the n-channel transistor 32 through the threshold voltage Vtn of the n-channel transistor 32 itself by raising the gate voltage of the n-channel transistor 32 to at least Vdd+2 Vtn for turning on the n-channel transistor 32 and thereafter moving the charge through the source and the drain of the n-channel transistor 32 thereby lowering the gate voltage of the n-channel transistor 32 to Vdd+2 Vtn and turning off the n-channel transistor 32. Thus, the ferroelectric memory can correctly set the gate-to-source voltage $V_{GS}$ Of the n-channel transistor 32 to the threshold voltage Vtn of the n-channel transistor 32. Therefore, the ferroelectric memory can suppress occurrence of such inconvenience that it is difficult to correctly set the gate-to-source voltage $V_{GS}$ of the n-channel transistor 32 to the threshold voltage Vtn of the n-channel transistor 32 due to dispersion in a manufacturing process, dissimilarly to a case of setting the gate-to-source voltage $V_{GS}$ of the n-channel transistor 32 to the threshold voltage Vtn of the n-channel transistor 32 through the threshold voltage of a transistor in a separately provided threshold voltage generation circuit. Thus, the ferroelectric memory according to the fourth embodiment can sufficiently transfer the charge responsive to the data of the memory cell 1 from the capacitor 35 to the bit line BL through the n-channel transistor 32 regardless of dispersion in the manufacturing process. Consequently, the ferroelectric memory can suppress reduction of a reading voltage in data reading regardless of dispersion in the manufacturing process.

According to the fourth embodiment, the ferroelectric memory setting the gate-to-source voltage $V_{GS}$ of the n-channel transistor 32 to the threshold voltage Vtn for bringing the n-channel transistor 32 into the OFF-state in the vicinity of the boundary state between ON- and OFF-states can turn on the n-channel transistor 32 by raising the gate-to-source voltage $V_{GS}$ of the n-channel transistor 32 to at least the threshold voltage Vtn of the n-channel transistor 32 when outputting negative charge responsive to the data of the memory cell 1 to the bit line BL for lowering the potential of the bit line BL in data reading. At this time, the ferroelectric memory can suppress reduction of the potential of the bit line BL resulting from the negative charge output from the memory cell 1 by transferring the negative charge from the bit line BL to the capacitor 35 and supplying positive charge from the capacitor 35 to the bit line BL through the n-channel transistor 32. Thus, the ferroelectric memory can suppress occurrence of disturbance (disappearance of data resulting from deterioration of a polarization state) caused by application of the lowered potential of the bit line BL to a ferroelectric capacitor 1a of another memory cell 1 linked with the same bit line BL as the memory cell 1 subjected to data reading.

According to the fourth embodiment, the ferroelectric memory can raise the potential of the node ND1 to the level (>Vdd+2 Vtn) higher than the potential (Vdd) of the bit line BL connected to the source of the n-channel transistor 32 before data reading by connecting a first electrode of the capacitor 35 to the drain of the n-channel transistor 32 and booting the potential of the node ND1 linked with the drain of the n-channel transistor 32 for raising the same through the capacitor 35. Thus, the ferroelectric memory can easily transfer the negative charge responsive to the data of the memory cell 1 from the bit line BL to the capacitor 35 through the n-channel transistor 32 in data reading. Therefore, the ferroelectric memory can easily associate the voltage of the node ND1 resulting from the charge stored in the capacitor 35 with the data of the memory cell 1.

Fifth Embodiment

Figure 9:
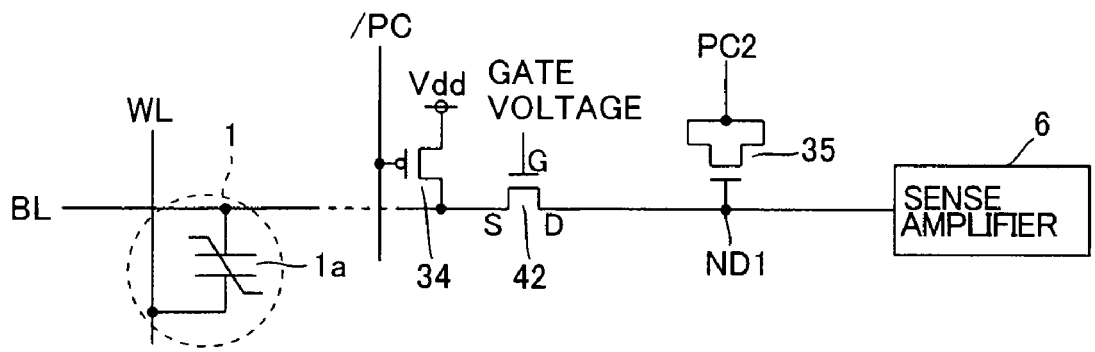
FIG. 9 is a circuit diagram showing the circuit structure of a ferroelectric memory according to a fifth embodiment of the present invention.

The circuit structure of a ferroelectric memory according to a fifth embodiment of the present invention is described with reference to FIG. 9.

The ferroelectric memory according to the fifth embodiment applies a potential Vdd to the gate of an n-channel transistor 42 connected between a bit line BL and a capacitor 35 and a sense amplifier 6, dissimilarly to the ferroelectric memory according to the aforementioned fourth embodiment. The n-channel transistor 42 is an example of the "first field-effect transistor" in the present invention. The threshold voltage Vtn0 of the n-channel transistor 42 is set to substantially 0 V. According to the fifth embodiment, the gate of the n-channel transistor 42 is not connected to a node ND1 connected with the capacitor 35, and the ferroelectric memory is provided with no n-channel transistor 33 corresponding to that connected between the node ND1 and the gate of the n-channel transistor 32 in the ferroelectric memory according to the fourth embodiment shown in FIG. 7. The remaining structure of the ferroelectric memory according to the fifth embodiment is similar to that of the ferroelectric memory according to the aforementioned fourth embodiment.

A data read operation of the ferroelectric memory according to the fifth embodiment is now described with reference to FIGS. 9 and 10.

Figure 10:
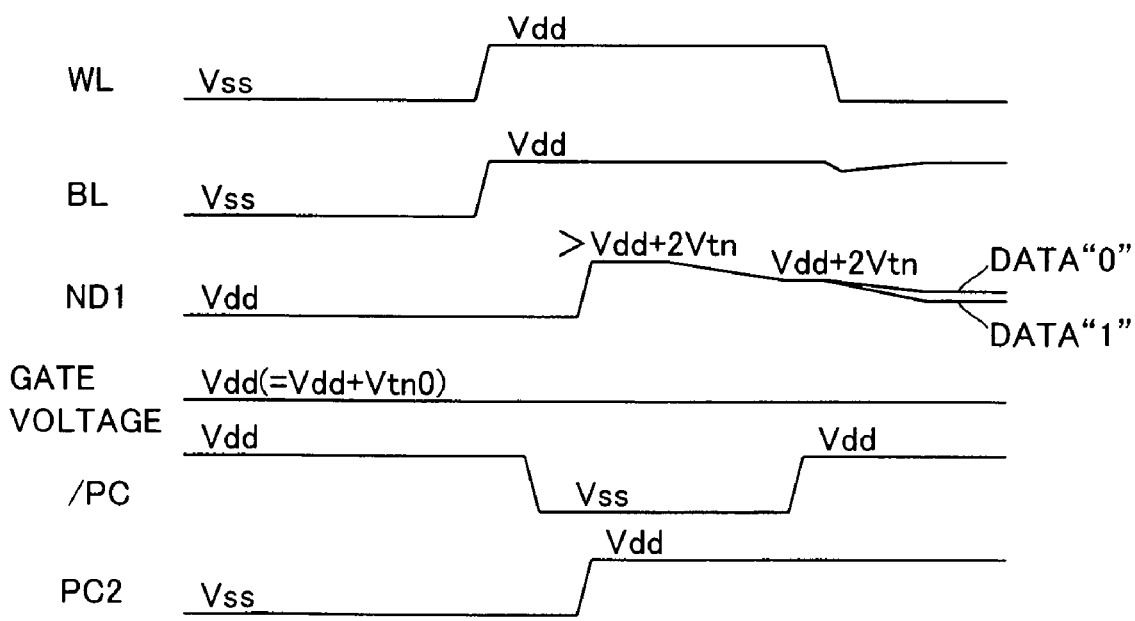
FIG. 10 is a voltage waveform diagram for illustrating a data read operation of the ferroelectric memory according to the fifth embodiment of the present invention.

In the ferroelectric memory according to the fifth embodiment, both of the potentials of a word line WL and the bit line BL are at Vss in an initial state of the data read operation, as shown in FIG. 10. The potential of a control signal /PC is at Vdd. Thus, a p-channel transistor 34 is in an OFF-state. The potential of the node ND1 is at Vdd.

According to the fifth embodiment, the ferroelectric memory applies the potential Vdd to the gate of the n-channel transistor 42 in the initial state. Thus, the ferroelectric memory holds the n-channel transistor 42 in an OFF-state in the vicinity of a boundary state between ON- and OFF-states due to the threshold voltage Vtn0 of the n-channel transistor 42 set to substantially 0 V. The node ND1 is in a floating state due to the OFF-state of the n-channel transistor 42. The potential of a control signal PC2 is at Vss.

Then, the ferroelectric memory simultaneously raises the potentials of the word line WL and the bit line BL to Vdd. At this time, the ferroelectric memory holds the potential difference between two electrodes of a ferroelectric capacitor 1a of a memory cell 1 at Vss (0 V), to read no data (output no charge) from the ferroelectric capacitor 1a to the bit line BL. Thereafter the ferroelectric memory lowers the potential of the control signal /PC to Vss. Thus, the ferroelectric memory turns on the p-channel transistor 34, thereby supplying the potential Vdd to the bit line BL through the p-channel transistor 34. Thus, the ferroelectric memory holds the potential of the bit line BL at Vdd.

According to the fifth embodiment, the ferroelectric memory then raises the potential of the control signal PC2 input in the capacitor 35 from Vss to Vdd. Thus, the ferroelectric memory boots the potential of the floating node ND1 connected with the capacitor 35 for raising the same through the capacitance of the capacitor 35. Therefore, the ferroelectric memory raises the potential of the node ND1 from Vdd to a higher level of at least Vdd+2 Vtn. At this time, the ferroelectric memory applies a potential fixed to Vdd to the gate of the n-channel transistor 42 while supplying the potential Vdd to the source thereof through the n-channel transistor 34, thereby holding the gate-to-source voltage $V_{GS}$ of the n-channel transistor 42 at 0 V (=threshold voltage Vtn0). Thus, the ferroelectric memory maintains the n-channel transistor 42 in the OFF-state in the vicinity of the boundary state between ON- and OFF-states.

Thereafter the ferroelectric memory raises the potential of the control signal /PC from Vss to Vdd, thereby turning off the p-channel transistor 34. At this time, the bit line BL enters a floating state since the p-channel transistor 42 is also in an OFF-state. Thereafter the ferroelectric memory lowers the potential of the word line WL from Vdd to Vss, thereby comparing a potential generated on the node ND1 with a reference potential through a sense amplifier 6 and determining data "0" or "1". At this time, the ferroelectric memory according to the fifth embodiment operates similarly to the ferroelectric memory according to the aforementioned fourth embodiment. The ferroelectric memory according to the fifth embodiment reads the data in the aforementioned manner.

According to the fifth embodiment, as hereinabove described, the ferroelectric memory can raise the potential of the node ND1 linked with either the source or the drain of the n-channel transistor 42 to the level (>Vdd+2 Vtn) higher than the potential (Vdd) of the bit line BL through the capacitor 35 before data reading, whereby no positive voltage generation circuit may be separately provided for generating a voltage for raising the potential of the node ND1 to the level higher than the potential (Vdd) of the bit line BL. Thus, the ferroelectric memory can suppress increase of the circuit scale thereof also when raising the potential of the node ND1 to the level higher than the potential (Vdd) of the bit line BL before data reading.

According to the fifth embodiment, the ferroelectric memory employing the n-channel transistor 42 having the threshold voltage Vtn0 of Vss (0 V) for controlling transfer of negative charge responsive to data of the memory cell 1 from the bit line BL to the node ND1 connected with the capacitor 35 can set the gate-to-source voltage $V_{GS}$ of the n-channel transistor 42 to the threshold voltage Vtn0 (0 V) for bringing the n-channel transistor 42 into the OFF-state in the vicinity of the boundary state between ON- and OFF-states by setting the potential of the source of the n-channel transistor 42 linked with the bit line BL to Vdd and applying the potential Vdd to the gate of the n-channel transistor 42 before data reading. Thus, the ferroelectric memory can set the gate-to-source voltage $V_{GS}$ of the n-channel transistor 42 to the threshold voltage Vtn0 of the n-channel transistor 42 through the generally employed potential Vdd, whereby no positive voltage generation circuit may be separately provided for generating a positive voltage higher than Vdd to be applied to the gate of the n-channel transistor 42, dissimilarly to a case of setting the gate-to-source voltage $V_{GS}$ of the n-channel transistor 42 controlling transfer of negative charge from the bit line BL to the capacitor 35 to the threshold voltage thereof by applying the positive voltage higher than Vdd to this gate, for example. Therefore, the ferroelectric memory can set the gate-to-source voltage $V_{GS}$ of the n-channel transistor 42 to the threshold voltage Vtn0 of the n-channel transistor 42 without increasing the circuit scale thereof.

In addition to the above, the ferroelectric memory according to the fifth embodiment can attain effects similar to those of the aforementioned fourth embodiment such as suppression of reduction of a reading voltage in data reading regardless of dispersion in a manufacturing process.

Sixth Embodiment

Figure 11:
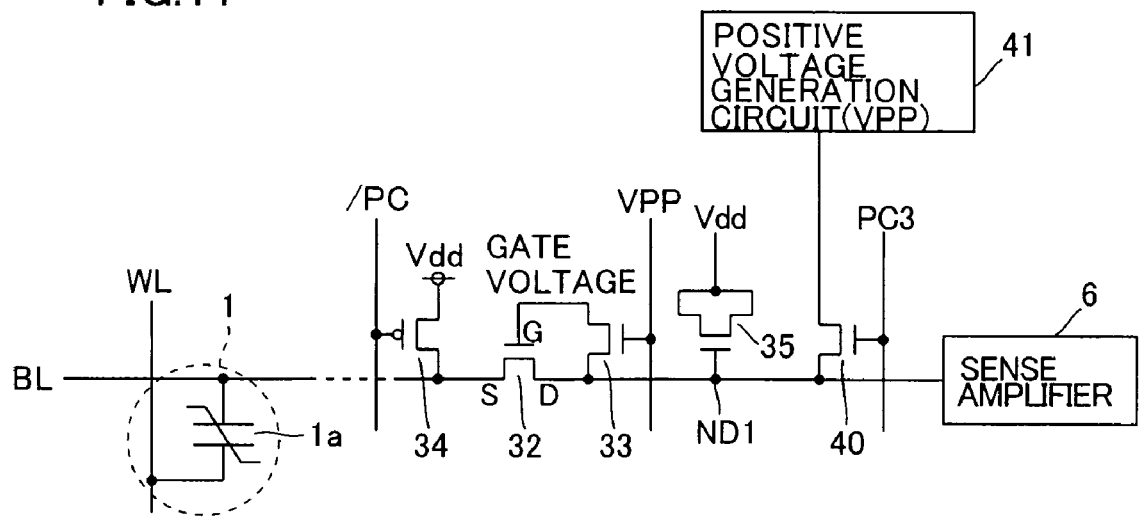
FIG. 11 is a circuit diagram showing the circuit structure of a ferroelectric memory according to a sixth embodiment of the present invention.

The circuit structure of a ferroelectric memory according to a sixth embodiment of the present invention is described with reference to FIG. 11.

The ferroelectric memory according to the sixth embodiment generates a positive potential higher than the potential of a bit line BL on a node ND1 through a positive voltage VPP generated by a separately provided positive voltage generation circuit 41 instead of generating the positive potential higher than the potential of the bit line BL on the node ND1 through a boot operation employing a capacitor 35, dissimilarly to the aforementioned fourth embodiment. More specifically, the source of an n-channel transistor 40 is connected to the node ND1 connected with the capacitor 35 in the ferroelectric memory according to the sixth embodiment, as shown in FIG. 11. The ferroelectric memory supplies the positive voltage VPP generated by the separately provided positive voltage generation circuit 41 to the drain of the n-channel transistor 40. The n-channel transistor 40 and the positive voltage generation circuit 41 are examples of the "fourth field-effect transistor" and the "voltage generation circuit" in the present invention respectively. According to the sixth embodiment, the positive voltage VPP is a constant voltage of at least Vdd+3 Vtn (Vtn: threshold voltage of n-channel transistors 32, 33 and 40), dissimilarly to the aforementioned fourth embodiment. The ferroelectric memory applies this positive voltage VPP also to the gate of the n-channel transistor 33 connected between the node ND1 and the gate of the n-channel transistor 32. The ferroelectric memory inputs a control signal PC3 in the gate of the n-channel transistor 40. Thus, the ferroelectric memory generates the positive potential higher than the potential of the bit line BL on the node ND1 through the positive voltage VPP supplied to the drain of the n-channel transistor 40 when turning on then-channel transistor 40 in response to the control signal PC3. A voltage applied to a first electrode of the capacitor 35 is fixed to Vdd. The remaining structure of the ferroelectric memory according to the sixth embodiment is similar to that of the ferroelectric memory according to the aforementioned fourth embodiment.

A data read operation of the ferroelectric memory according to the sixth embodiment is now described with reference to FIGS. 11 and 12.

Figure 12:
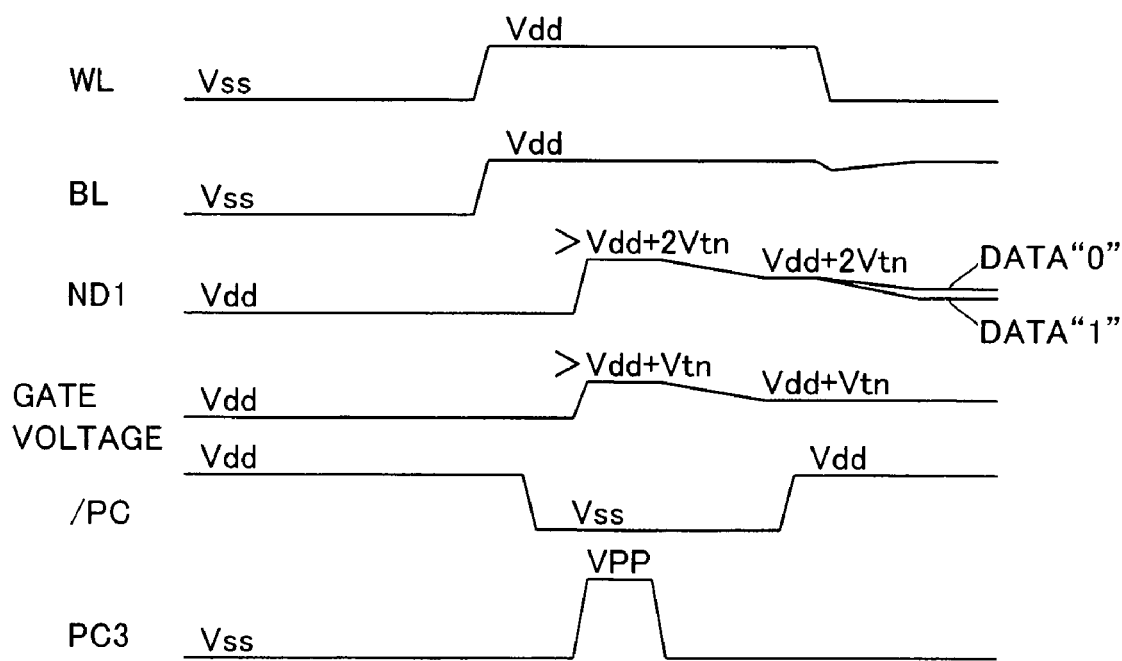
FIG. 12 is a voltage waveform diagram for illustrating a data read operation of the ferroelectric memory according to the sixth embodiment of the present invention.

In the ferroelectric memory according to the sixth embodiment, both of the potentials of a word line WL and the bit line BL are at Vss in an initial state of the data read operation, as shown in FIG. 12. The potential of a control signal /PC is at Vdd. Thus, the p-channel transistor 34 is in an OFF-state. Both of the gate voltage of the n-channel transistor 32 and the potential of the node ND1 are at Vdd. At this time, the gate-to-source voltage $V_{GS}$ of the n-channel transistor 32 is at substantially 0 V, whereby the n-channel transistor 32 is in an OFF-state. The potential of the control signal PC3 is at Vss. Thus, the n-channel transistor 40 is in an OFF-state. Therefore, the node ND1 is in a floating state. The ferroelectric memory inputs the positive voltage VPP set at the constant level of at least Vdd+3 Vtn (Vtn: threshold voltage of the n-channel transistors 32, 33 and 40) in the gate of the n-channel transistor 33. Thus, the n-channel transistor 33 is in an ON-state.

Then, the ferroelectric memory simultaneously raises the potentials of the word line WL and the bit line BL to Vdd. At this time, the ferroelectric memory holds the potential difference between two electrodes of a ferroelectric capacitor 1a of a memory cell 1 at Vss (0 V), to read no data (output no charge) from the ferroelectric capacitor 1a to the bit line BL. Thereafter the ferroelectric memory lowers the potential of the control signal /PC to Vss. Thus, the ferroelectric memory turns on the p-channel transistor 34, for supplying the potential Vdd to the bit line BL through the p-channel transistor 34. Thus, the ferroelectric memory holds the potential of the bit line BL at Vdd.

According to the sixth embodiment, the ferroelectric memory then raises the potential of the control signal PC3 input in the gate of the n-channel transistor 40 from Vss to VPP (>Vdd+3 Vtn). Thus, the ferroelectric memory turns on the n-channel transistor 40, thereby supplying the positive potential to the node ND1 through the n-channel transistor 40. Thus, the ferroelectric memory charges the capacitor 35 and raises the potential of the node ND1 from Vdd. At this time, the ferroelectric memory raises the potential of the node ND1 only to a level lower than the positive voltage VPP (>Vdd+3 Vtn) supplied to the n-channel transistor 40 by the threshold voltage Vtn of the n-channel transistor 40. Therefore, the ferroelectric memory raises the potential of the node ND1 to a positive level of at least Vdd+2 Vtn from Vdd.

Following this rise of the potential of the node ND1, the potential of the gate (gate voltage) of the n-channel transistor 32 linked to the node ND1 through the n-channel transistor 33 also goes up. At this time, the gate voltage of the n-channel transistor 32 goes up only to a level lower than the positive potential (>Vdd+2 Vtn) of the node ND1 by the threshold voltage Vtn of the n-channel transistor 33. Thus, the ferroelectric memory raises the gate voltage of the n-channel transistor 32 to a positive level of at least Vdd to Vtn. At this time, the n-channel transistor 32 enters an ON-state. Thereafter the ferroelectric memory lowers the potential of the control signal PC3 from VPP to Vss. Thus, the n-channel transistor 40 enters an OFF-state. The ferroelectric memory supplies the potential Vdd to the ON-state n-channel transistor 32 through the p-channel transistor 34, the source and the drain of the n-channel transistor 32 and the p-channel transistor 33. Thus, the ferroelectric memory lowers the gate voltage (>Vdd+Vtn) of the n-channel transistor 32 toward Vdd.

According to the sixth embodiment, the gate-to-source voltage $V_{GS}$ of the n-channel transistor 32 reaches the threshold voltage Vtn when the gate voltage thereof reaches Vdd+Vtn, thereby turning off the n-channel transistor 32. Thus, the ferroelectric memory stops lowering the gate voltage of the n-channel transistor 32 when the gate voltage goes down to Vdd+Vtn. At this time, the ferroelectric memory holds the n-channel transistor 32 in an OFF-state in the vicinity of a boundary state between ON- and OFF-states. When the n-channel transistor 32 enters the ON-state, the potential of the node ND1 also goes down from the level of at least Vdd+2 Vtn due to the potential Vdd supplied through the p-channel transistor 34 and the source and the drain of the n-channel transistor 32. When the gate-to-source voltage $V_{GS}$ of the n-channel transistor 32 reaches the threshold voltage Vtn to turn off the n-channel transistor 32, the ferroelectric memory also stops lowering the potential of the node ND1. At this time, the potential of the node ND1 is Vdd+2 Vtn.

Thereafter the ferroelectric memory raises the potential of the control signal /PC from Vss to Vdd, thereby turning on the p-channel transistor 34. At this time, the bit line BL enters a floating state since the n-channel transistor 32 is also in an OFF-state. Thereafter the ferroelectric memory lowers the potential of the word line WL from Vdd to Vss, thereby comparing a potential generated on the node ND1 with a reference potential through a sense amplifier 6 and determining data "0" or "1". At this time, the ferroelectric memory according to the sixth embodiment operates similarly to the ferroelectric memory according to the aforementioned fourth embodiment. The ferroelectric memory according to the sixth embodiment reads the data in the aforementioned manner.

The ferroelectric memory according to the sixth embodiment can attain effects similar to those of the aforementioned first embodiment such as suppression of reduction of a reading voltage in data reading regardless of dispersion in a manufacturing process.

Although the present invention has been described and illustrated in detail, it is clearly understood that the same is by way of illustration and example only and is not to be taken by way of limitation, the spirit and scope of the present invention being limited only by the terms of the appended claims.

For example, each of the aforementioned embodiments has been described with reference to the ferroelectric memory employed as an exemplary memory to which the present invention is applied, the present invention is not restricted to this but is applicable to various memories other than the ferroelectric memory.

What is claimed is:

1. A memory comprising:
   a memory cell connected to a bit line for holding data;
   charge storage means;
   a first field-effect transistor connected between said bit line and said charge storage means for controlling a transfer of a charge responsive to said data held in said memory cell from said bit line to said charge storage means; and
   data determination means reading said data of said memory cell corresponding to a voltage resulting from said charge stored in said charge storage means, and
   setting the potential difference between a control terminal and a first remaining terminal of said first field-effect transistor through the threshold voltage of said first field-effect transistor to said threshold voltage for bringing said first field-effect transistor into an OFF-state in the vicinity of a boundary state between ON- and OFF-states.

2. The memory according to claim 1, wherein
   said control terminal and a second remaining terminal of said first field-effect transistor are connected with each other,
   the memory turns on said first field-effect transistor by changing the potential of said control terminal of said first field-effect transistor to a first potential rendering the absolute value of the potential difference between said control terminal and said first remaining terminal of said first field-effect transistor larger than the absolute value of said threshold voltage and thereafter turning off said first field-effect transistor by moving said charge through said first and second remaining terminals of said first field-effect transistor thereby raising or lowering the potential of said control terminal of said first field-effect transistor and bringing the potential of said control terminal of said first field-effect transistor to a second potential for equalizing the potential difference between said control terminal and said first remaining terminal of said first field-effect transistor to said threshold voltage.

3. The memory according to claim 2, wherein
   said control terminal of said first field-effect transistor is the gate of said first field-effect transistor,
   said first remaining terminal of said first field-effect transistor is the source of said first field-effect transistor, and
   said second remaining terminal of said first field-effect transistor is the drain of said first field-effect transistor.

4. The memory according to claim 2, wherein
said first remaining terminal of said first field-effect transistor is connected to a third potential having an absolute value smaller than the absolute value of said second potential.

5. The memory according to claim 4, further comprising a second field-effect transistor connected between said first remaining terminal of said first field-effect transistor and said third potential.

6. The memory according to claim 5, setting the potential of said control terminal of said first field-effect transistor to said second potential for equalizing the potential difference between said control terminal and said first remaining terminal of said first field-effect transistor to said threshold voltage and turning off said first field-effect transistor by moving said charge toward said third potential through said second field-effect transistor due to turning on said first field-effect transistor by changing the potential of said control terminal of said first field-effect transistor to said first potential when said second field-effect transistor is in an ON-state.

7. The memory according to claim 5, wherein
said bit line is connected to said first remaining terminal of said first field-effect transistor,
the memory turns off said second field-effect transistor when outputting said charge responsive to said data of said memory cell to said bit line.

8. The memory according to claim 2, further comprising a third field-effect transistor connected between said control terminal and said second remaining terminal of said first field-effect transistor, for holding the potential difference between said control terminal and said first remaining terminal of said first field-effect transistor at least at the threshold voltage of said first field-effect transistor.

9. The memory according to claim 8, wherein
said first field-effect transistor and said third field-effect transistor are of the same conductive type, and have substantially identical threshold voltages.

10. The memory according to claim 1, wherein
a first electrode of said charge storage means is connected to said second remaining terminal of said first field-effect transistor, and
said charge storage means has a function of raising or lowering the potential of said second remaining terminal of said first field-effect transistor.

11. The memory according to claim 10, wherein
said charge storage means includes a capacitor.

12. The memory according to claim 11, wherein
a first electrode of said capacitor is connected to said second remaining terminal of said first field-effect transistor,
the memory raises or lowers the potential of said second remaining terminal of said first field-effect transistor by raising or lowering a potential applied to a second electrode of said capacitor.

13. The memory according to claim 1, wherein
said first remaining terminal of said first field-effect transistor is connected to said bit line,
the memory changes the potential difference between said control terminal and said first remaining terminal of said first field-effect transistor by raising or lowering the potential of said bit line by outputting said charge responsive to said data of said memory cell to said bit line thereby raising or lowering the potential of said first remaining terminal of said first field-effect transistor for turning on said first field-effect transistor.

14. The memory according to claim 13, setting the potential difference between said control terminal and said first remaining terminal of said first field-effect transistor to said threshold voltage for bringing said first field-effect transistor into said OFF-state in the vicinity of said boundary state between ON- and OFF-states before outputting said charge responsive to said data of said memory cell to said bit line.

15. The memory according to claim 1, wherein
the threshold voltage of said first field-effect transistor is substantially 0 V,
the memory applies a voltage of substantially 0 V to said control terminal of said first field-effect transistor.

16. The memory according to claim 1, wherein
said bit line is connected to said first remaining terminal of said first field-effect transistor and said charge storage means is connected to said second remaining terminal of said first field-effect transistor,
the memory further comprises a voltage generation circuit connected to said second remaining terminal of said first field-effect transistor.

17. The memory according to claim 16, raising or lowering the potential of said second remaining terminal of said first field-effect transistor beyond the potential of said first remaining terminal of said first field-effect transistor with said voltage generation circuit before transferring said charge responsive to said data of said memory cell from said bit line to said charge storage means through said first field-effect transistor.

18. The memory according to claim 16, further comprising a fourth field-effect transistor connected between said second remaining terminal of said first field-effect transistor and said voltage generation circuit.

19. The memory according to claim 18, raising or lowering the potential of said second remaining terminal of said first field-effect transistor beyond the potential of said first remaining terminal of said first field-effect transistor with said voltage generation circuit by turning on said fourth field-effect transistor before transferring said charge responsive to said data of said memory cell from said bit line to said charge storage means through said first field-effect transistor.

20. The memory according to claim 1, wherein
said memory cell comprises a ferroelectric capacitor.

* * * * *